(12) United States Patent
Bao

(10) Patent No.: US 6,452,207 B1
(45) Date of Patent: Sep. 17, 2002

(54) ORGANIC SEMICONDUCTOR DEVICES

(75) Inventor: Zhenan Bao, North Plainfield, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 5 days.

(21) Appl. No.: 09/823,796

(22) Filed: Mar. 30, 2001

(51) Int. Cl.[7] .............................................. H01L 35/24
(52) U.S. Cl. ......................... 257/40; 257/289; 438/99
(58) Field of Search ...................... 257/40, 289; 438/99, 438/142; 372/44

(56) References Cited

U.S. PATENT DOCUMENTS

| | | | | |
|---|---|---|---|---|
| 5,708,130 A | * | 1/1998 | Woo et al. | ................... 528/397 |
| 5,962,631 A | * | 10/1999 | Woo et al. | ................... 529/397 |
| 6,107,452 A | * | 8/2000 | Miller et al. | ................... 528/42 |
| 6,169,163 B1 | * | 1/2001 | Woo et al. | ................... 528/397 |
| 6,204,515 B1 | * | 3/2001 | Bernius et al. | ............... 257/40 |
| 6,372,154 B1 | * | 4/2002 | Li | ......................... 252/301.16 |

* cited by examiner

*Primary Examiner*—Sara Crane
(74) *Attorney, Agent, or Firm*—Peter V. D. Wilde

(57) ABSTRACT

The specification describes a thin film transistor device in which the semiconductor layer is a fluorene oligomer having a molecular weight of less than 2000, and comprising from 1 to 10 fluorene ring units. These oligomers can be deposited by simple evaporation to give desirable semiconductor properties, e.g. high mobility.

7 Claims, 12 Drawing Sheets

ORGANIC SEMICONDUCTOR DEVICES

FIELD OF THE INVENTION

This invention relates to improvements in organic semiconductor materials, and more particularly to improvements in thin film transistors (TFT) devices and thin film lasers with organic semiconductors.

BACKGROUND OF THE INVENTION

Over the last decade, IC technologies have been proposed that use organic semiconductor thin film transistors (TFTs). The chief attractions of such circuits stem from the anticipated ease of processing and compatibility with flexible substrates. These advantages are expected to translate into a low-cost IC technology suitable for applications such as smart cards, electronic tags, and displays.

TFT devices are described in F. Garnier et al., Science, Vol. 265, pp. 1684–1686; H. Koezuka et al., Applied Physics Letters, Vol. 62 (15), pp. 1794–1796; H. Fuchigami et al., Applied Physics Letters, Vol. 63 (10), pp. 1372–1374; G. Horowitz et al., J. Applied Physics, Vol. 70(1), pp. 469–475; and G. Horowitz et al., Synthetic Metals, Vol. 42–43, pp. 1127–1130. The devices described in these references are based on polymers or oligomers as the active materials, in contrast with the amorphous silicon and polysilicon TFT structures that were developed earlier. The devices are typically field effect transistors (FETs). Organic active devices have significant advantages over earlier semiconductor TFTs in terms of simplicity of processing and resultant low cost. They are also compatible with polymer substrates used widely for interconnect substrates. Organic TFTs are potentially flexible, and polymer TFT ICs can be formed directly on flexible printed circuit boards. They also have compatible coefficients of thermal expansion so that solder bonds, conductive expoxy bonds, and other interconnections experience less strain than with semiconductor IC/polymer interconnect substrate combinations. While metal-insulator-semiconductor (MIS) FET devices are most likely to find widespread commercial applications, TFT devices that utilize both p-type and n-type organic active materials are also known. See e.g., U.S. Pat. No. 5,315,129. S. Miyauchi et al., Synthetic Metals, 41–43 (1991), pp. 1155–1158, disclose a junction FET that comprises a layer of p-type polythiophene on n-type silicon.

Recent advances in organic based TFT devices are described in U.S. Pat. No. 5,596,208, issued May 10, 1996, U.S. Pat. No. 5,625,199, issued Apr. 29, 1997, and U.S. Pat. No. 5,574,291, issued Nov. 12, 1996. With the development of both n-type and p-type active polymer materials, as described in these patents, complementary ICs can be readily implemented, as detailed particularly in U.S. Pat. No. 5,625,199.

With the basic organic TFT technology now well established, refinements in the materials used to make these structures can be expected. In particular, advances in semiconductor materials are continually being sought to improve the electrical performance of these devices. Higher mobility semiconductors would be especially useful.

To date, most p-channel organic semiconductor are based on thiophene derivatized oligomers and polymers. In addition, there are a few other systems based on aromatic macrocyclics, such as metallopthalocyanines, and fused aromatic ring structures such as pentacene and tetracene. Very few other types of conjugated systems have been explored. In addition, most of the reported p-channel semiconductors have relatively low bandgap and high HOMO level. Therefore they tend to be easily photo-oxidized which causes degradation of the resulting devices.

Recent work with fluorene conjugated materials has shown useful semiconductor characteristics. See Sirringhaus et al., Applied Physics Letters, Vol. 77, No. 3, July 2000. However, the fluorene material reported by these workers is produced by a liquid crystal (LC) technique and requires alignment of LC domains using a special transistor structure developed for this LC material. Such an approach complicates transistor fabrication and adds cost.

SUMMARY OF THE INVENTION

Fluorene based organic semiconductor materials have been developed that show improved transistor performance and do not require either special preparation or special transistor structures. Generally speaking, these materials are fluorene-containing oligomers. Due to high steric hindrance between fluorene and other co-oligomer units, the resulting oligomers have relatively high bandgaps and low HOMO levels. These semiconductors have shown high on/off ratios with good aging characteristics. In addition, the bandgap and emission wavelengths of these materials can be easily tuned by changing the co-oligomer unit structure. The ability for color tuning the emission wavelength of the organic semiconductor, while maintaining high carrier mobility gives rise to multicolor electrically injected organic semiconductor lasers.

These materials can be prepared as polycrystalline thin films that do not require crystallographic alignment to give good electrical performance.

DETAILED DESCRIPTION

It will be understood that the invention resides in improved organic semiconductor materials for semiconductor devices. Given here is a complete description of one type of semiconductor device that forms a preferred embodiment of the invention.

Figure 1:
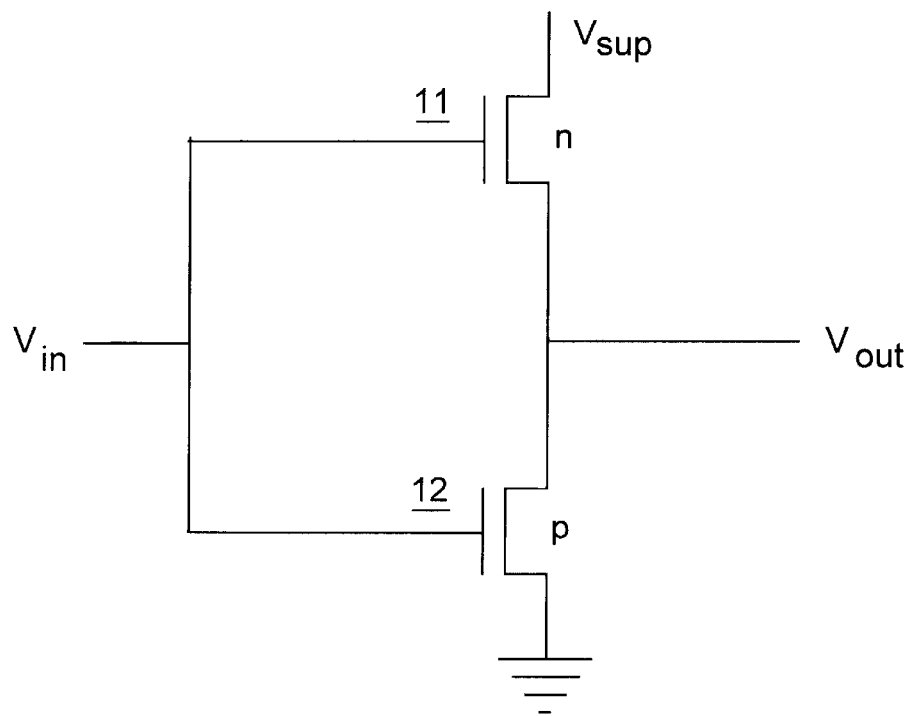
FIG. 1 is a schematic circuit diagram for a simple inverter using a CMOS pair of TFT devices fabricated in accordance with the invention.

A processing sequence for making TFT CMOS devices with the electrodes of the invention is described as follows in conjunction with FIGS. 1–19. The device used for illustration is a CMOS pair for the simple inverter circuit of in FIG. 1, where n-channel TFT is designated 11 and p-channel TFT is designated 12. The p-channel transistor may be used as driver for the n-channel load.

The TFT device structure used for the process illustration is the upside-down configuration that is described and claimed in U.S. patent application Ser. No. 09/137,920 filed Aug. 20, 1998, which is incorporated herein by reference. This TFT structure offers several advantages. It can be made with simple processing. The deposition of the semiconductor layer occurs late in the process thus avoiding hostile process conditions such as etchants, cleaning agents, high temperature, etc. Importantly, the upside down structure, as described here, has inherent electrical isolation between devices in a CMOS pair as well as between pairs. Moreover, the structure allows interconnection layers to be formed prior to transistor formation, which feature has important advantages in some technologies. However, it will be understood by those skilled in the art that this example is given for illustrative purposes and the invention can as easily be applied to regular TFT devices, with the gate and interconnection on top, or other suitable semiconductor device structures.

Figure 2:
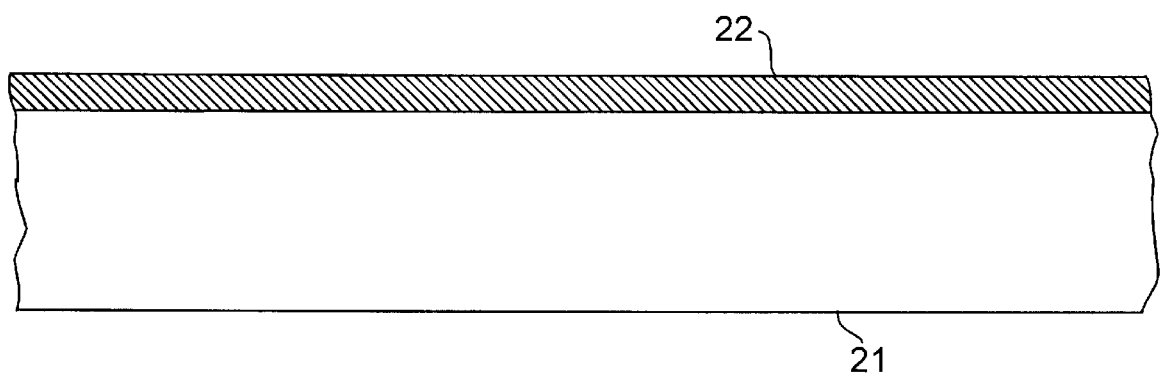
FIGS. 2–19 are schematic representations of process steps useful for forming the organic semiconductor TFT CMOS inverter circuit of FIG. 1.

Referring to FIG. 2, a portion of an IC substrate is shown at 21. A single TFT CMOS pair will be illustrated for simplicity, but it will be understood that the single pair of devices is representative of a large integrated array of devices. Also, the features shown in the figures herein are not to scale. Substrate 21 is an insulating material such as ceramic, glass, or a polymer. It may be rigid or flexible, and it may comprise a standard printed circuit substrate of glass reinforced epoxy, or polyimide. Alternatively it may be silicon on which an insulating layer of $SiO_2$ is grown or deposited. The first level metal is shown as 22. In this inverted structure this level is referred to as the first level because it is formed first but, as will be appreciated by those skilled in the art, it corresponds to the second or third level metal in traditional structures. The metal may be any of a variety of conductive materials. The common choice in standard IC technology is aluminum. However, due to the nature of the structures described here the choice of conductive material can be made from a larger universe than is usually considered, including the standard materials, i.e. aluminum, TiPdAu, TiPtAu, $TaN_x$, $TiN_x$, Au, Ni, etc., as well as non-traditional choices most notably copper, and conductive polymers such as polyaniline and metal-containing polymer inks. The use of polymer conductors may be favored in applications where a degree of flexibility is desired. The choice of deposition technique is wide since the structures at this stage in the processing, as contrasted with traditional IC processing at this stage, have no thermally sensitive components. Thus this deposition step, as well as subsequent deposition and etching steps used for forming the two level or multi-level metallization interconnections, may involve significant substrate heating if that is otherwise convenient and cost effective. Accordingly, the metal layer can be evaporated, or sputtered. The thickness of the metal layer can vary widely, but will typically be in the range of 0.05 to 2 μm.

Figure 3:
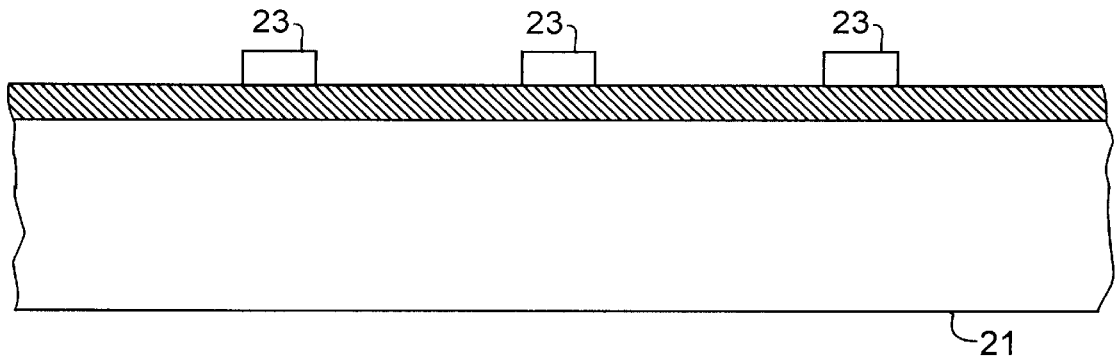
Figure 4:
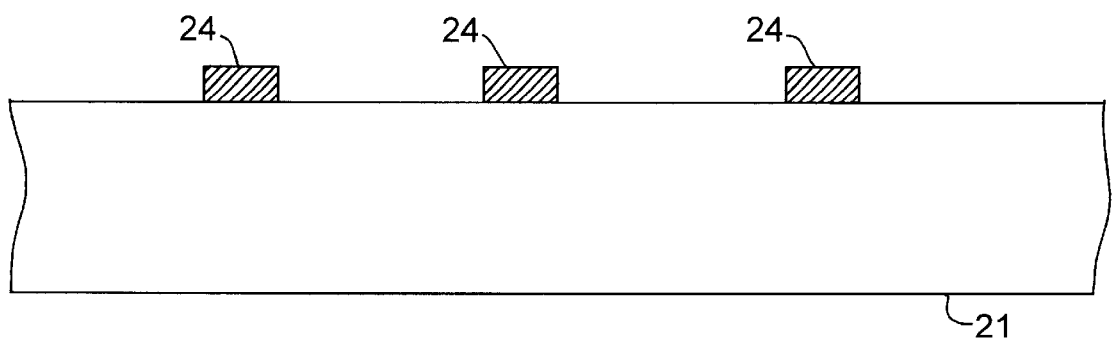

The next step, represented by FIG. 3, is to pattern the first level metallization using a lithographic mask 23. The mask is typically made by photolithography, but may also be formed using other forms of lithography. Other masking steps, to be described below, may also utilize these alternative lithography technologies. The first metal layer is then patterned by standard etching, e.g. plasma or RIE etching, to produce the pattern of metal runners 24 as shown in FIG. 4.

With a wide choice of conductive materials available, it may be useful, in applications where the interconnect density is not large, to print the circuit directly, using screen printing, stenciling, ink jet printing, or a similar technique.

Figure 5:
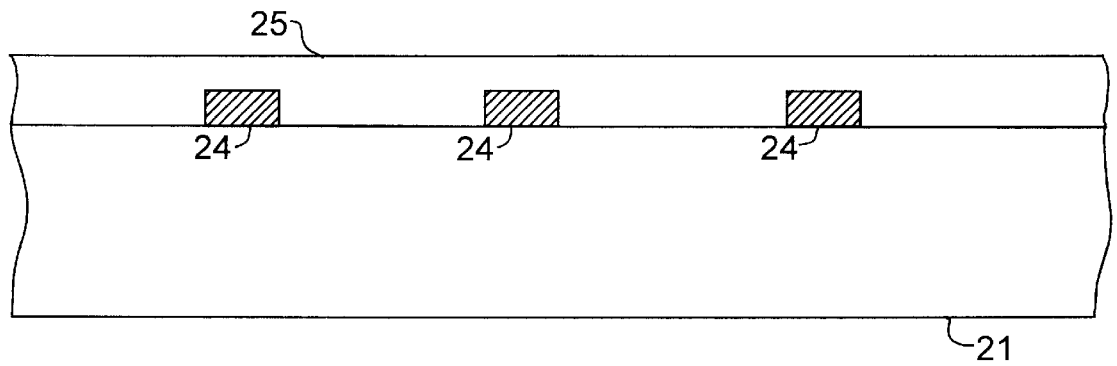

With reference to FIG. 5, the first interlevel dielectric 25 is formed over the first level metal pattern as shown. The interlevel dielectrics in the structures according to the invention may be chosen from a variety of insulating materials such as spin on glass (SOG), or $Si_3N_4$ or $SiO_2$ deposited by CVD for example. In the TFT structures described here, it is expected that the use of polymer materials wherever they can be effective will be desirable, both from the standpoint of processing simplicity and cost, and also to produce IC structures that tolerate strain, i.e. are somewhat flexible. Accordingly, for such applications the use of polyimide or similar organic polymer insulating material is recommended. A suitable material is a polyimide supplied by Nissan Chemical Company under the designation RN-812. This material can easily be deposited in layers with 0.1–1 μm thickness, which have desirable insulating properties. The application technique for organic insulators is typically spin coating or solution casting. Some inorganic insulators, notably spin-on-glass, also share the property of convenient application. In some applications, e.g. where fine pattern dimensions are not required, the dielectric layer may be applied as a patterned layer, already containing the interlevel windows.

Figure 6:
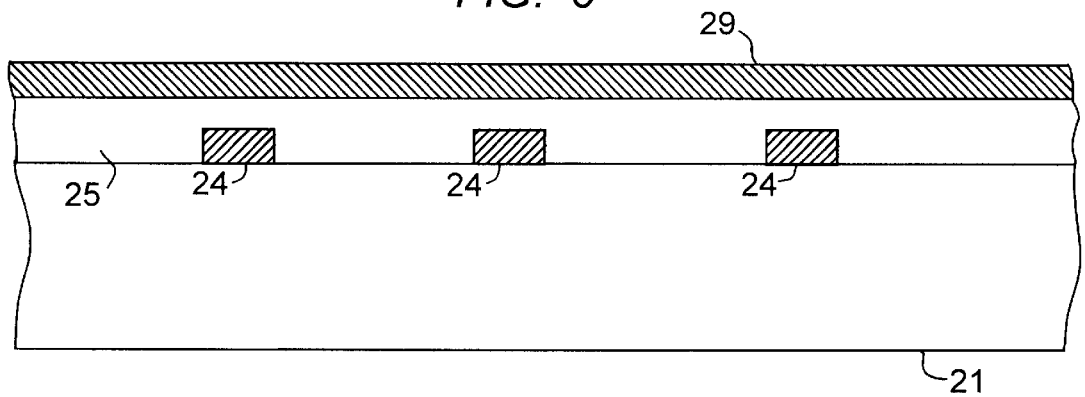
Figure 7:
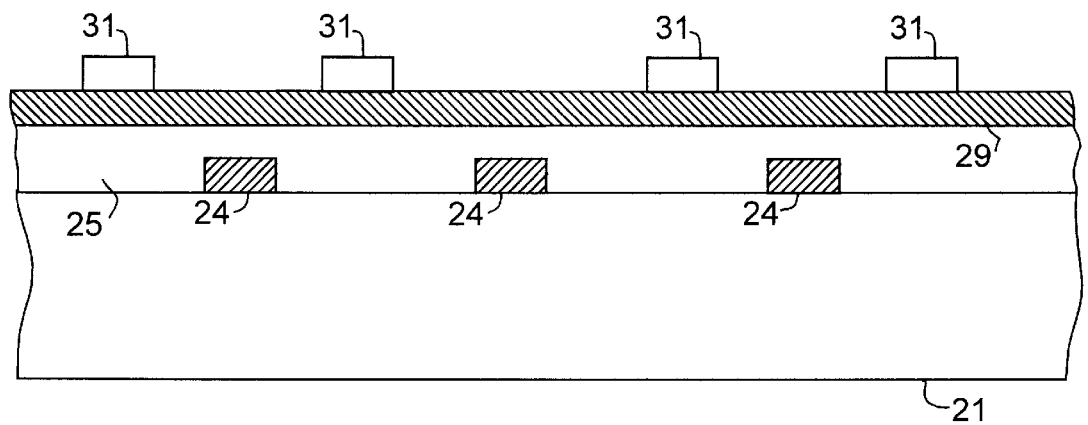
Figure 8:
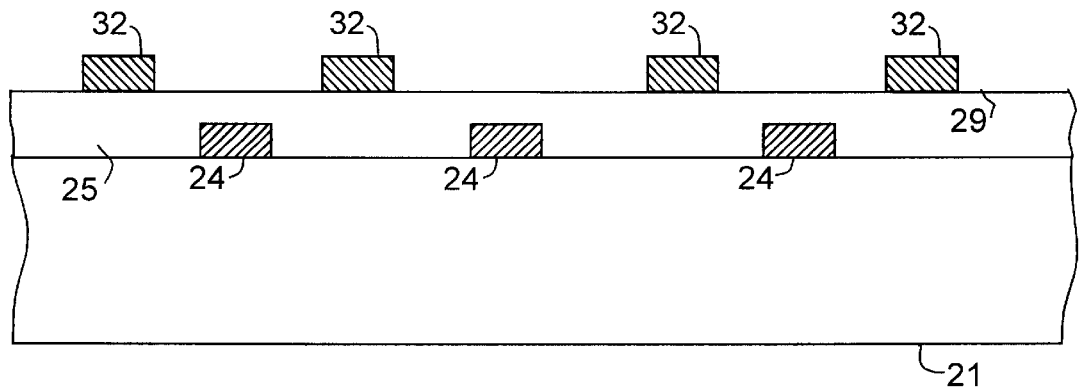

The second level metal, 29, is deposited over the first interlevel dielectric 25 as shown in FIG. 6. The second level metal may be the same as, or may be different from, the first level metal. The second level metal is patterned in a manner similar to the first level using mask 31 to form runners 32 as shown in FIGS. 7 and 8.

Figure 9:
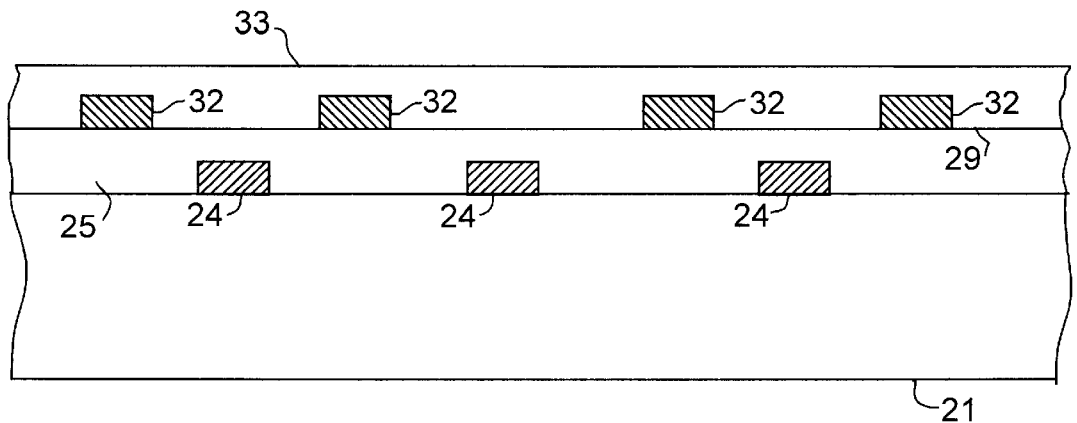
Figure 10:
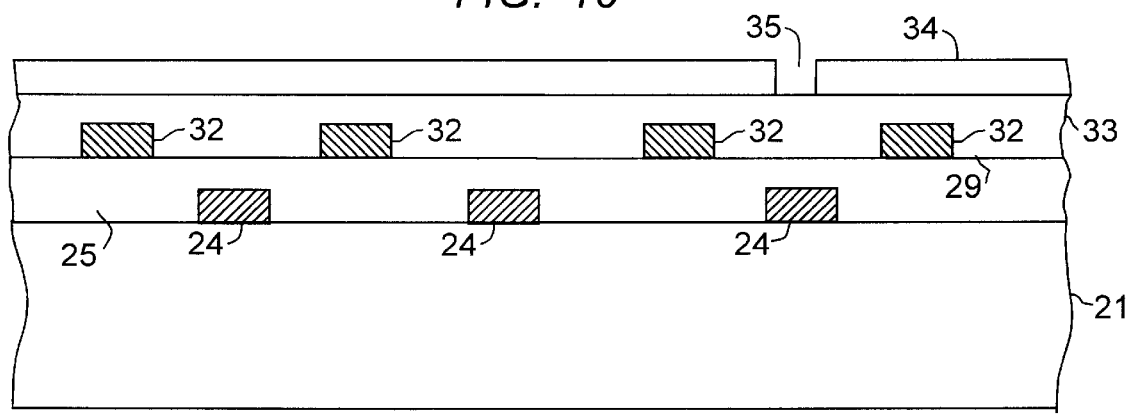
Figure 11:
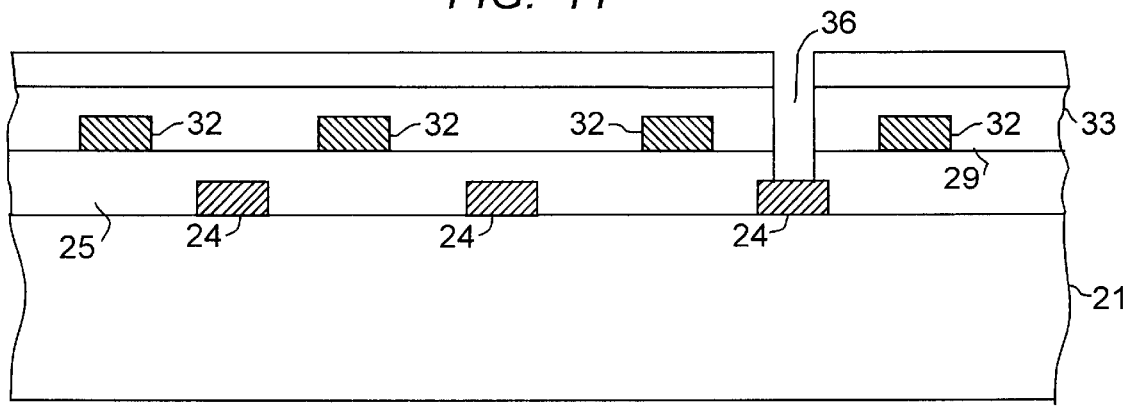

The next step forms the second interlevel dielectric 33 as shown in FIG. 9. This layer may be formed in a manner similar to layer 25. Interlevel dielectric 33 is provided with through holes or windows for interlevel interconnections between the first level (24) and the gate level to be formed next. The interlevel dielectric is masked with patterned mask 34 as shown in FIG. 10, and the portion of dielectric layer 33 exposed by the opening 35 in the resist is etched to form a window to interconnect the first and gate levels. The mask opening is aligned to metal runner 24 in the first level interconnection pattern. A single interlevel interconnection is shown for simplicity, but a typical IC will have many such interlevel interconnections. These interlevel interconnections are standard, and techniques for forming the interlevel windows are well known. For example, if the dielectric layer is $SiO_2$ the windows may be formed by plasma etching or RIE. The resulting structure is shown in FIG. 11, with interlevel window 36 formed in the dielectric layers 25 and 33. Alternatively, interlevel windows or vias can be made directly using a photodefinable polymer dielectric such as polyimide, or, if polymer material is used for the interlevel dielectric, the vias can be made using laser processing.

The gate level metal, usually the first level metal in a traditional structure, and usually of polysilicon, is formed late in the sequence of the invention, and may comprise a wide variety of metals. The usual requirement that the gate level metal be relatively refractory to withstand the conventional implantation drive steps is eliminated in the process of the invention, so the gate material can be selected from many materials, even aluminum or copper. However, the art has extensive experience with silicon gates insulated with grown $SiO_2$. Tantalum gates covered with TaN or TiN may also be convenient. Conducting polymers are also suitable for the gate metal and are especially compatible with other elements in the structures described here. Gold and indium tin oxide (ITO) are also useful gate electrode materials.

Figure 12:
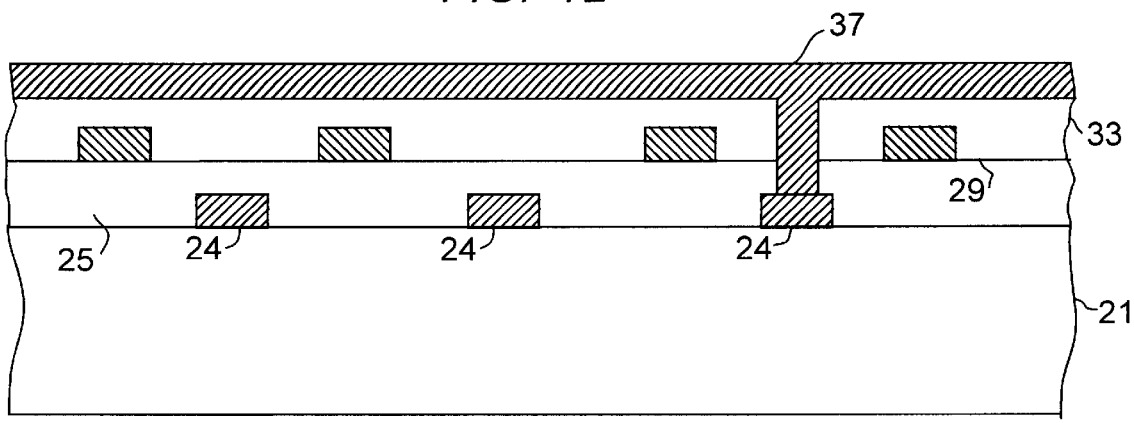
Figure 13:
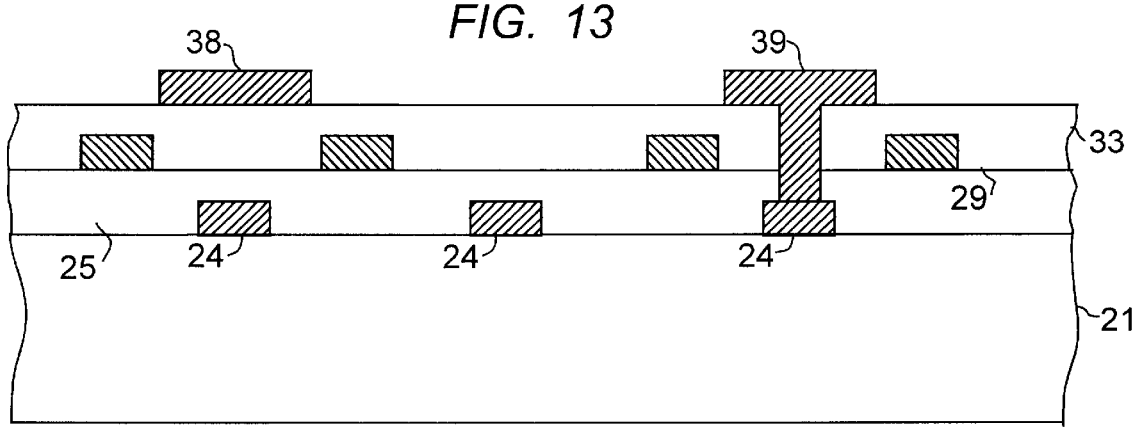

The gate metal layer 37 is shown in FIG. 12 deposited over the second interlevel dielectric layer 33 and into the windows that will interconnect selected gates to the first level metal. The gate metal layer is then patterned (FIG. 13) by lithography to form gate structures 38 and 39. Gate 38 is interconnected on the gate level and gate 39 is interconnected, in this illustrative arrangement, to runner 24 on the first level. For simplicity, the metal is shown deposited into the window as a part of the gate metal deposition step. As known by those skilled in the art, interlevel plug technologies can be used for forming the interlevel interconnections.

Figure 14:
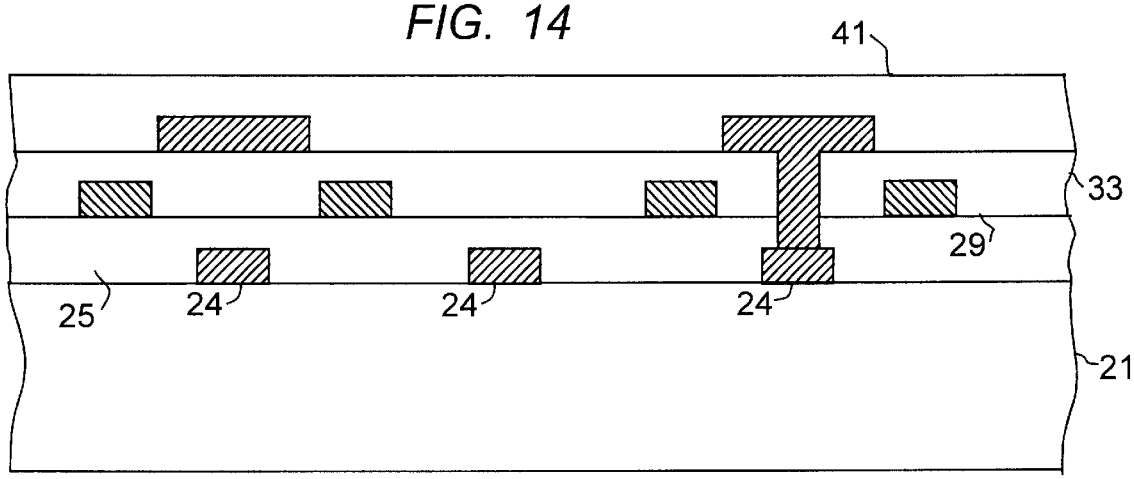

The gate dielectric 41 is then formed over the structure as shown in FIG. 14. The gate dielectric may be of a conventional oxide or nitride, or combination thereof such as 200 nm $Si_3N_4$ and 100 nm $SiO_2$, or may be $Al_2O_3$, deposited by r-f magnetron sputtering. The gate dielectric may also be SOG or an organic insulator such as polyimide that can be formed conveniently by spin-on techniques. An example of such a material that has been used successfully in this application is pre-imidized polyimide, supplied by Nissan Chemical Company under the designation SE-1180. This material can be spun on at 4000 RPM and cured at 120° C. for 2 hours to produce a coating with a thickness of 70 nm. If desired, the gate material may be polysilicon, and the gate dielectric grown as a surface layer over the polysilicon in which case the gate dielectric layer 41 would not cover the entire second interlevel dielectric as it appears in FIG. 14.

Figure 15:
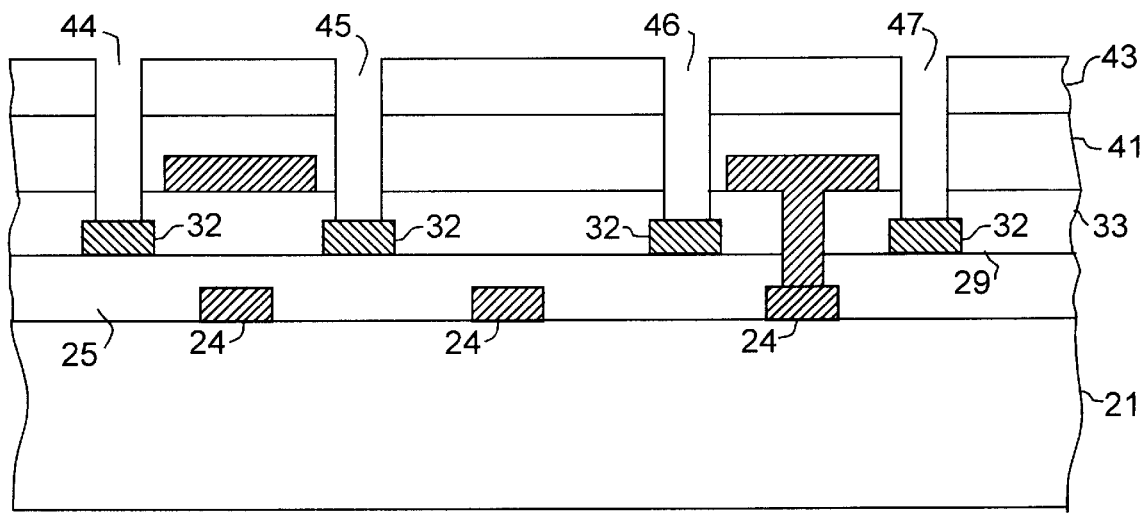

The gate dielectric is masked with patterned mask 43 as shown in FIG. 15, and the portion of gate dielectric layer 41 and the underlying portion of dielectric layer 33 exposed by the openings 44, 45, 46, and 47 in the resist, is etched to form a window to interconnect the source drain contacts to the second metal level. The mask openings are aligned to metal runners 32 in the second level interconnection pattern.

Figure 16:
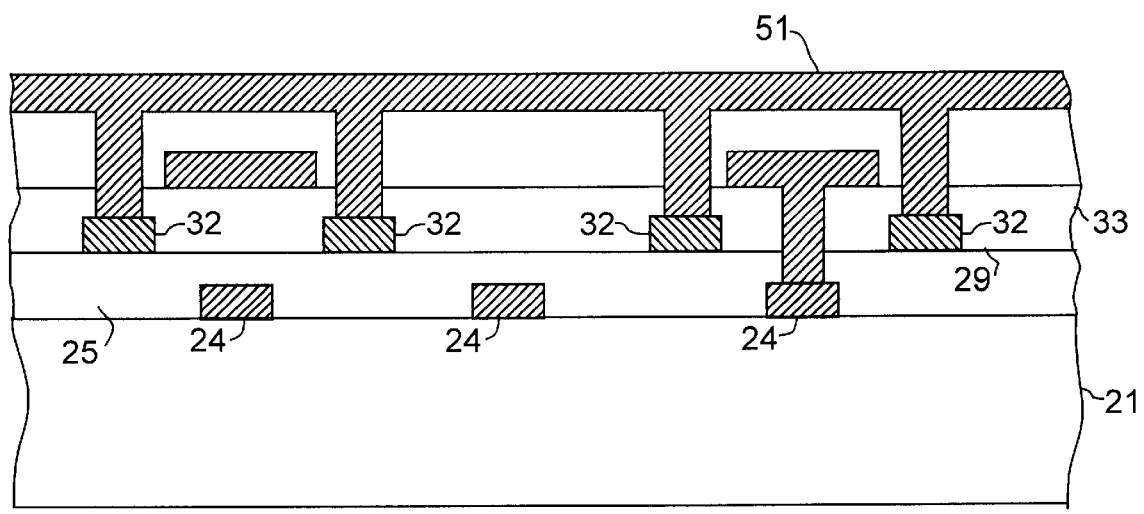
Figure 17:
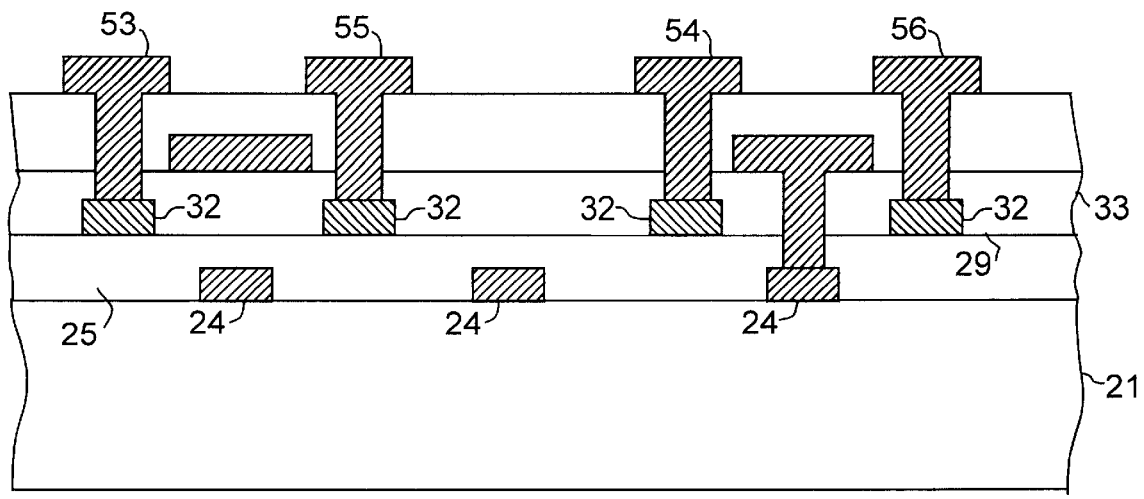

The interlevel plugs and the source/drain contact layer 51 is then deposited over the structure as shown in FIG. 16, and metal plug contact is made to the second level runners 32. Layer 51 is then patterned using a conventional lithographic mask (not shown) to define source electrodes 53, 54 and drain electrodes 55, 56, as shown in FIG. 17. As is well known, the position of the source and drain electrodes should be adjacent to the gate electrode in the vertical plane, or should overlap slightly the edge of the gate electrode. The formation of the source and drain contacts according to the invention will be described more fully below.

Figure 18:
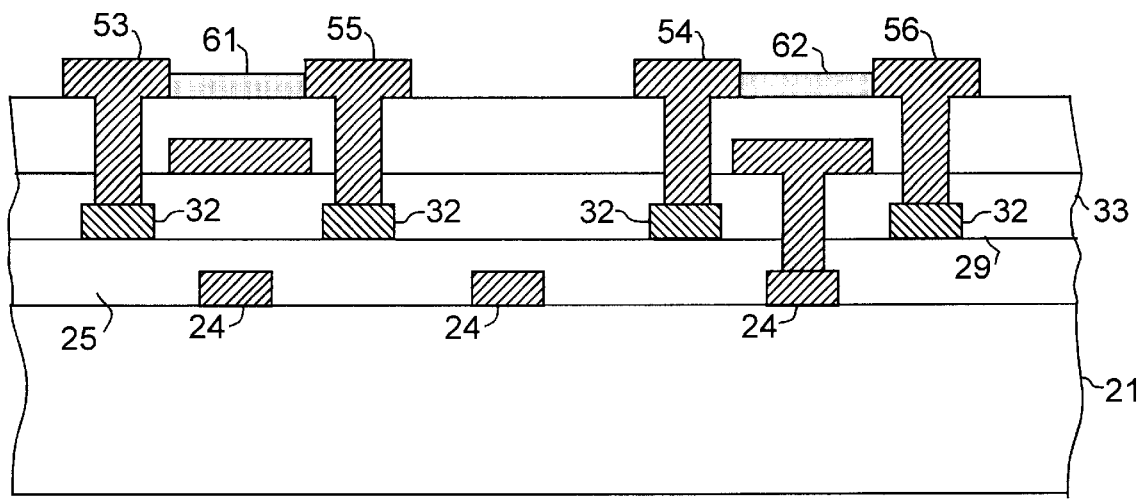

One of the last steps in the process of the invention, which is the first step in the traditional FET process, is illustrated in FIG. 18 and is the formation of the active semiconductor bodies 61, 62 in which the field effect is realized, and in which the FET channel extends between sources 53, 54 and drains 55, 56. The active material is an organic semiconductor of the invention, which will be described in detail below.

Figure 19:
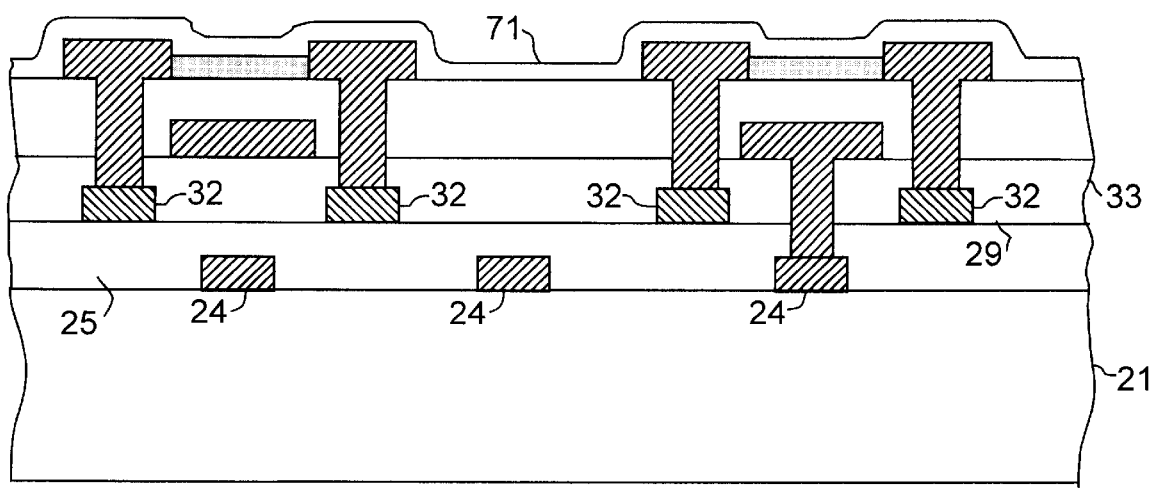

If necessary, the device can be sealed using a passivating layer 71 as shown in FIG. 19.

The TFT structure described and produced by the foregoing sequence of steps is but one form of TFT to which the invention can be applied. An alternative is a conventional MOS transistor structure in which the organic semiconductor is the substrate, the source and drain electrodes are applied to the organic semiconductor substrate, the gate dielectric is formed on the organic semiconductor substrate, and then the gate electrode is formed.

Another alternative transistor structure for TFT devices is a modified form of J-FET with n-type and p-type layers together forming a p-n junction. A gate controls the pinch-off of the channel between source and drain.

As indicated earlier, the features in the figures are not necessarily to scale. The dimensions of the active devices, i.e. the TFTs, can be made very small using fine line techniques. In particular, the source-to-drain spacing can be 5 nm or less. At these small dimensions a single polymer chain, or a few organic molecules span the source-to-drain distance. With such an IC technology, it is possible to achieve extremely high integration densities. The molecular nature of organic/polymer semiconductors allows the size of such transistors to shrink to such small dimensions, and also enables effective isolation between individual transistors. The dimensions of some of the interconnections, e.g. power and ground interconnections, may be significantly larger than those that appear in the figures.

The process sequence shown above for making the CMOS inverter circuit has three metal levels, partly to show the potential of the process for making more complex circuits. It will be evident to those skilled in the art that the simple inverter of FIG. 1 can be made with two levels of interconnect if the n- and p-devices are properly arranged for negative and positive supply busses on the same level.

A wide variety of organic semiconductors have now been developed for TFT devices. As mentioned, most p-channel organic semiconductor are based on thiophene derivatized oligomers and polymers. The p-channel materials according to this invention are oligomers of fluorene. Examples of suitable materials are shown in FIGS. 20A–20F and are designated with a shorthand for this discussion according to the following table.

Figure 20A:
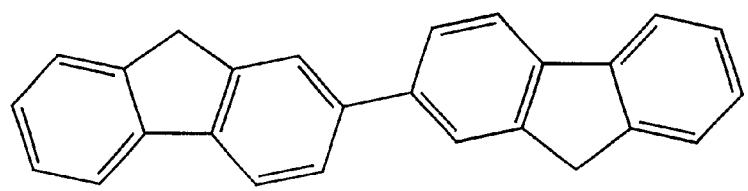
FIGS. 20A–20F are diagrams of organic structures characteristic of the materials of the invention.
Figure 20B:
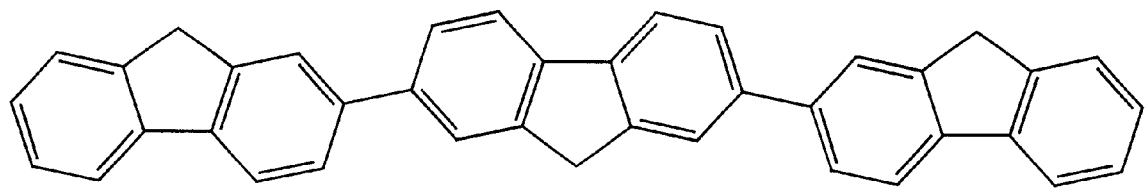
Figure 20D:
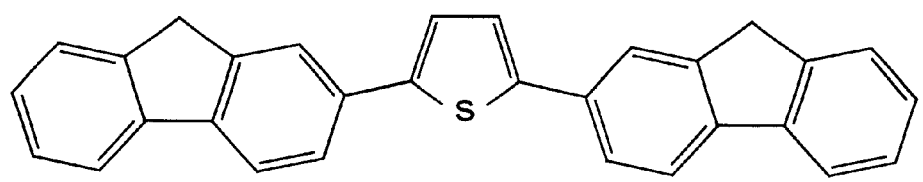
Figure 20C:
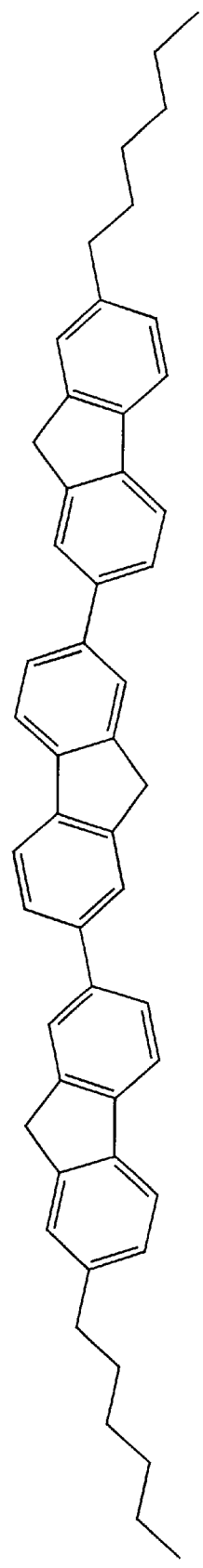
Figure 20E:
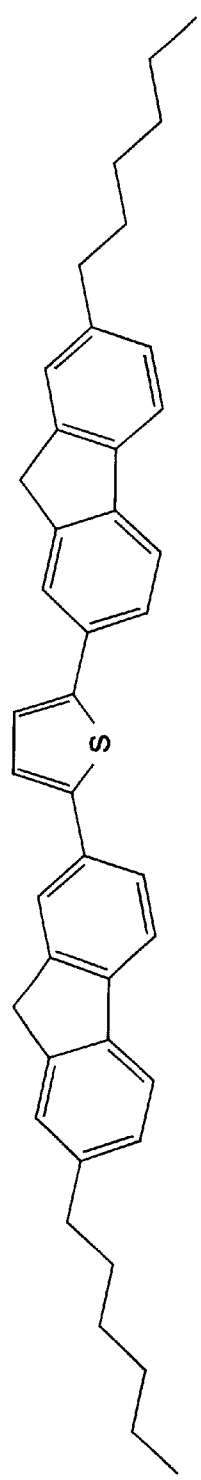
Figure 20F:
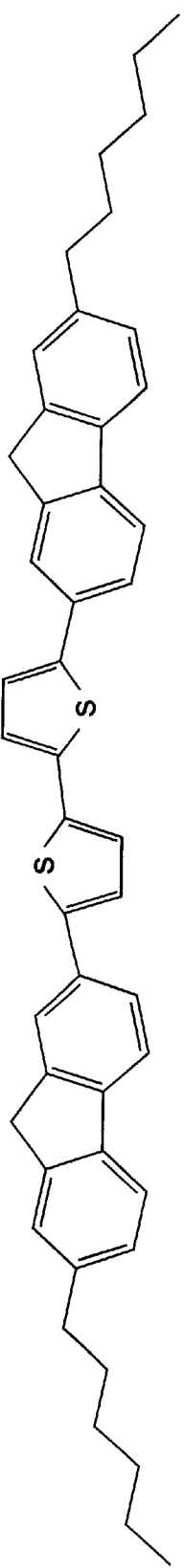

| FIG. 20A | 2F |
| FIG. 20B | 3F |
| FIG. 20C | DH-3F |
| FIG. 20D | FTF |
| FIG. 20F | DH-FTF |
| FIG. 20F | FTTF |

These materials were prepared by synthesis techniques that produced coupling of the conjugated fluorene ring structures without intermediate substituents. Two coupling methods were found suitable. They are: 1. the palladium (0) catalyzed Stille reaction and 2. the Suzuki reaction. Thiophene rings may be incorporated as shown in FIGS. 20D (FTF) and 20E (DH-FTF) as examples of color tuning of the oligomers while maintaining high carrier mobility.

X-ray diffraction analyses were performed on films vacuum deposited on $Si/SiO_2$ substrates. No annealing or special alignment means were used. All of the films were highly ordered as deposited as evidenced by the fact that sharp diffraction peaks were observed, even, in some cases, to the fourth order. For unsubstituted oligomers (except 3F of FIG. 20B), the separation between layers calculated from 2θ is almost the same as the length of the oligomers calculated using Spartan program and Gaussian 98, indicating that these oligomers adapt edge-on orientation similar to other conjugated oligomers. This type of orientation has been found particularly useful to achieve high mobilities since the π—π stacking direction is in the plane of current flow. For the 3F material of FIG. 20B, some diffraction peaks at large 2θ angles are also observed, corresponding to spacings of 3–4 Angstroms. These peaks are likely due to the π—π stacking distance from molecules with their molecular plane aligned parallel to the substrate surface. In addition, two phases were observed as indicated by small shoulders next to the main peaks. Increasing substrate temperature during deposition decreases one of the peaks indicating more homogeneity. The dihexyl substituted oligomers also appear to adapt the edge-on orientation with the hexyl side chains interdigitated.

Figure 21:
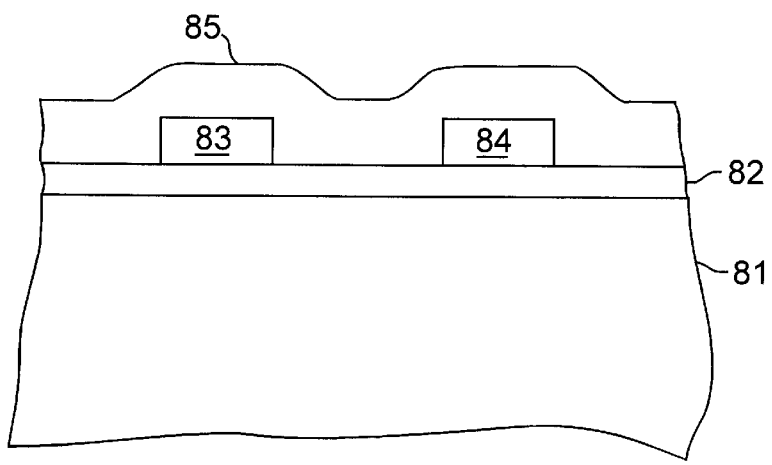
FIG. 21 is a schematic diagram of an MOS transistor device using the materials of the invention.

The transistor behavior of these oligomers was studied using the device structure described in connection with FIGS. 2–19 (bottom gate). The actual structure used was a simplified version of that shown in FIG. 19 and is shown schematically in FIG. 21, where the transistor structure is built on an N-doped silicon substrate 81, which serves as the gate. Gate dielectric 82 covers the silicon substrate and source and drain contacts 83, 84 are formed on the gate dielectric. Numeral 85 designates the oligomer material of the invention. It will be understood that the invention applies as well to the MOS transistor structure in which the organic oligomer semiconductor is the substrate, the source and drain electrodes are applied to the organic oligomer semiconductor substrate, the gate dielectric is formed on the organic oligomer semiconductor substrate, and the gate electrode is formed on the top (top gate). All the fluorene containing oligomers perform as p-type transistors and are accumulation devices.

Figure 22:
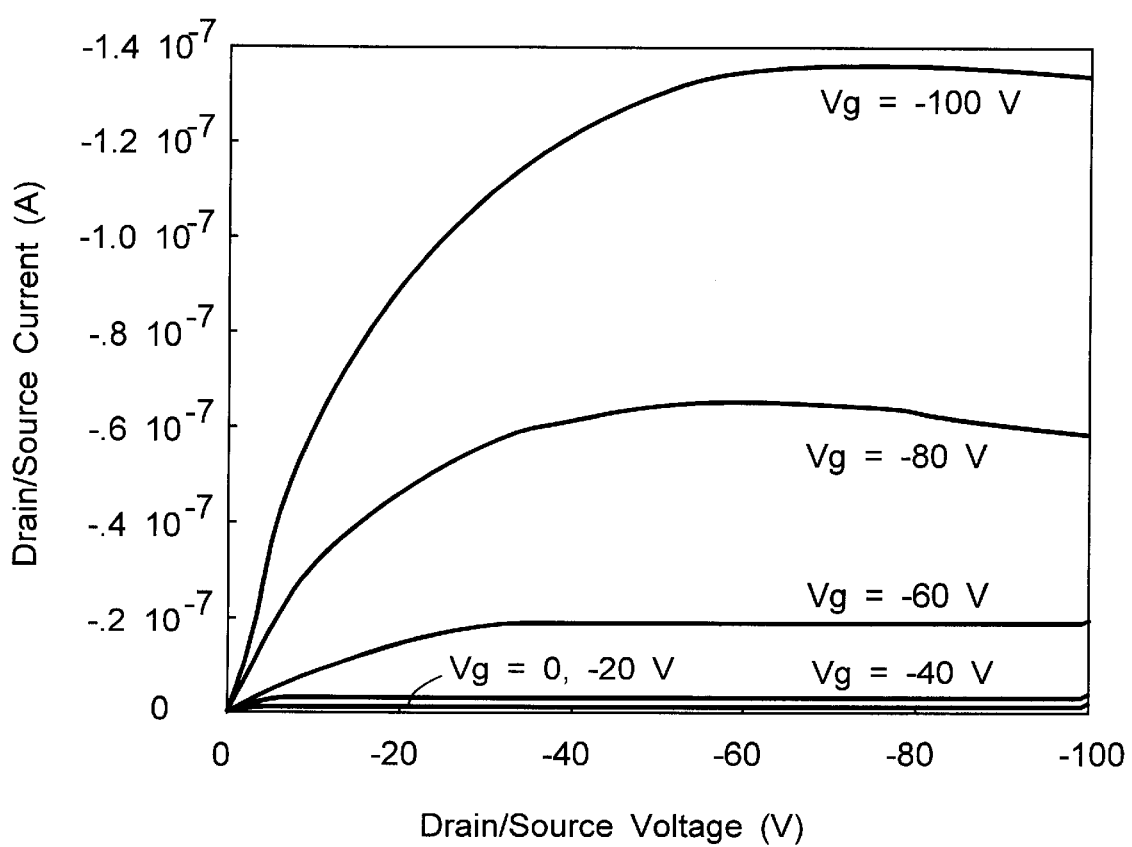
FIG. 22 is an I-V plot of MOS transistor characteristics.

FIG. 22 shows the typical drain-source current ($I_{DS}$) vs. voltage characteristics of a FET with 3F as the semiconducting layer deposited at substrate temperature for deposition ($T_D$) at room temperature with a channel length of 12 μm at different gate voltages. It is seen that the drain-source current scales up with increasing gate voltage (VG). The devices were determined to work in the accumulation region as p-type from the fact that both the field-enhanced current and VG have negative signs.

The field effect mobilities of all oligomers obtained at different $T_D$ are summarized in Table 1. All the devices were fabricated using the bottom gate structure. In this structure, the drain and source electrodes can fabricated above (top-contact, designated as (T)) or underneath (bottom-contact, designated as (B)).

TABLE II

|  | mobility | on/off |
| --- | --- | --- |
| 2F (B): |  |  |
| @ RT | 1e-6 | 100 |
| 2F (T): |  |  |
| @ RT | 5-8e-5 | 200–300 |
| 3F (B): |  |  |
| @ RT | 1.1-1.92e-3 | 1000 |
| @ 80° C. | 0.9-1.1e-2 | 7000–8000 |
| @ 145° C. | 4-6e-5 | 1000–3000 |
| 3F (T): |  |  |
| @ RT | 2-2.7e-3 | 3000–6000 |
| @ 80° C. | 0.9-1.1e-2 | 8000–9000 |
| @ 145° C. | 1.7-2.3e-2 | 4000 |
| DH-3F (B): |  |  |
| @ RT | 5e-5 | 1000 |
| @ 100° C. | 2e-6 | 500 |
| DH-3F (T): |  |  |
| @ RT | 1.05e-3 | 1000–3000 |
| @ 100° C. | 6-8e-4 | 1000–2000 |
| FTF (B): |  |  |
| @ RT | 0.65-1.1e-4 | 3000 |
| @ 100° C. | no activity |  |
| FTF (T): |  |  |
| @ RT | 7.9-8.9e-4 | 500–2000 |
| @100° C. | 1.3-2.3e-3 | 1700–5000 |
| DH-FTF (B): |  |  |
| @ RT | 0.75-1.46e-3 | 700–2000 |
| @ 100° C. | 1.1-1.8e-3 | 1000–3000 |
| DH-FTF (T): |  |  |
| @ RT | 0.93-1.1e-2 | 1000–5000 |
| @ 100° C. | 2.5-2.7e-2 | 1000–4000 |
| FTTF (B): |  |  |
| @ RT | 1-1.6e-2 | 2500–3500 |
| @ 100° C. | 2.9-3.3e-2 | 500 |
| FTTF (T): |  |  |
| @ RT | 2.6e-2 | 11700 |
| @ 100° C. | 7.2-8.3e-2 | 7000–9000 |

It is noted that the mobilities depend strongly on both the deposition conditions and device geometry. It has been previously found that the mobility of most organic semiconductors strongly depends on the substrate temperature $T_D$ during deposition. Similar trends are found with these fluorene-containing oligomers. In general, the field effect mobility increases with increasing $T_D$ resulting from better ordered thin films and larger grain sizes. Indeed, X-ray diffraction patterns showed higher diffraction intensity for thin films of the same thickness deposited at higher $T_D$. The transmission electron micrographs also showed sharper grain boundaries and larger grain sizes for higher $T_D$ thin films.

The mobilities of the oligomer devices prepared using bottom contact structures tend to be lower than those using top contact structures. The best mobilities were obtained with 3F, FTTF, and DH-FTF. It is somewhat surprising that there is a large variation in the mobilities even though almost all the oligomers had very similar molecular orientations and grain sizes. For 2F, the poor mobility may be related to its low HOMO level making it difficult for hole injection. In addition, its relatively short conjugation length makes it harder for π—π overlap. Similar trend was found with α-tetrathiophene and α-sexithiophene (α-6T).

In the case of α-sexithiophene, substitution with dihexyl side chains results in increased mobility. In our case, it seems to be dependent on the nature of the core conjugate unit. For DH-3F, the mobility is significantly lower compared to 3F, while the mobility of DH-FTF is more than an order of magnitude higher than FTF. The electron diffraction patterns show that the lateral packing of the molecules in 3F and DH-3F, FTF and DH-FTF are very similar, but not identical (presumably because the di-hexyl end groups emerge at an angle to the conjugated core). All of these oligomers form surprisingly small crystalites (100 nm at room temperature, 200–300 nm at 100° C.). However, the high mobility 3F and DH-FTF seem to show more superb crystallinity. Despite the similar grain sizes, DH-3F films showed more diffused grain boundaries, indicating poorer crystallinity. In addition, the more diffused grain boundary may result in much higher barrier for charge transport. For DH-FTF, the crystals grown at 100° C. exhibit regular crystallographic faceting and multilayer tetraces, which are indications of very high crystallinity. The above results demonstrate that the field effect mobility of molecular semiconductors are extremely sensitive to not only the molecular energy levels, orientation, crystallinity, grain size, but also are sensitive to the details at the grain boundary. In addition, the detailed molecular orientation and trapping sites at the semiconductor/dielectric interface may also play an important role.

The on/off ratios of the fluorene containing oligomers are relatively high (more than 1000) without any special optimization effort. Careful purification of the semiconducting materials, surface treatment of the dielectric surface, and patterning of the semiconducting layer may lead to improved on/off ratios. Among all the new oligomers, 3F showed exceptionally high on/off ratio. That is related to its high bandgap and relatively low HOMO level making it difficult to be doped by oxygen causing high off-current. In addition, the 3F devices showed extremely good stability over long storage time in air with exposure to ambient light. No increase in on/off ratio was observed for more than three months. Many other high mobility organic semiconductors, such as α-6T and pentacene, start to have decreased on/off ratio hours after contact with air with exposure to ambient light. The high stability of 3F is extremely valuable for realizing highly stable organic electronic devices.

The oligomers of the invention not only have high field effect mobilities, they also have useful emission properties.

The oligomer units in the materials of the invention contain from 1–10 fluorene units. If the material has one fluorene unit, at least one additional ring structure unit is recommended. In this case both units should be fully conjugated. If the material comprises 2 fluorene units connected end to end either directly, i.e. a single bond, or through an intermediate ring unit (not fluorene) the 2 fluorene units and the intermediate unit should be fully conjugated. Symmetrical structures are preferred. This definition prescribes the basic unit structure. Substituents on one or more rings can be added as desired.

In addition the oligomer materials of the invention have a molecular weight of less than 2000. This distinguishes these materials, which can be prepared as described below by simple vacuum deposition, from polymer materials that require special processing to align domains in the thin film layer.

The following is an example of a technique for producing thin films of the materials of the invention.

The resulting oligomers were purified twice by vacuum sublimation at a pressure of $8 \times 10^{-4}$ Torr or lower for three times. The transistor device structure was that shown in FIG. 21. N-doped Si substrate 81 functions as the gate, and an oxide layer 82 of 3000 Å, having a capacitance per unit area of 10 nF/cm$^2$, is the gate dielectric. The source and drain contacts, formed on the gate dielectric, are gold. Thin oligomer films were prepared by vacuum deposition at a rate of 4 to 5 Å/s under a pressure of $2.0 \times 10^{-6}$ Torr to a final thickness of between 500 and 600 Å. Different substrate temperatures were used during deposition by mounting the substrate onto a heated or cooled copper block controlled by a temperature controller and measured by a thermocouple. The electric characteristics of these devices were measured in air and are given in Table II.

The field-effect mobility was calculated from:

$$I_{DS} = (WC_i/2L)\mu(V_G - V_O)^2$$

where $I_{DS}$ is the drain-source current in the saturated region, $\mu$ is the field-effect mobility, W is the channel width, L is the channel length, and $C_i$ is the capacitance per unit area of the insulating layer (SiO$_2$, 3000 Å, $C_i$=10 nF/cm$^2$). $V_O$ is the extrapolated threshold voltage and can be obtained from a plot of $I_{DS}^{1/2}$ vs. $V_G$ after extrapolation of the linear region to the $V_G$ axis.

N-channel device materials, used in CMOS devices with the materials of the invention are conventional. Among these are:

i. perylenetetracarboxylic dianhydride (PTCDA)

ii. the imide derivatives of PTCDA;

iii. napthalenetetracarboxylic dianhydride (NTCDA);

iv. fluorinated derivatives of (NTCDA);

v. fluorinated copper pthalocyanine.

Figure 23:
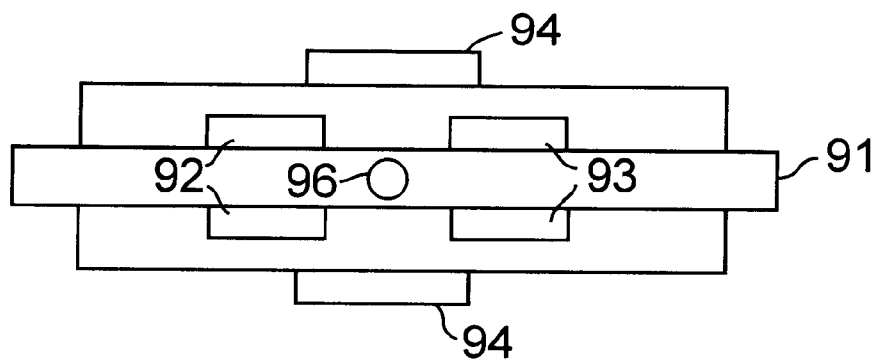
FIG. 23 is a schematic diagram of a laser device using the materials of the invention.

The oligomers of the invention not only have high field effect mobilities, they also have useful emission properties and can be used in photonic devices such as lasers. A schematic view of a laser according to the invention is shown in FIG. 23, where the oligomer semiconductor of the invention is shown at 91, source electrodes at 92, drain electrodes at 93 and gate electrodes at 94. The photoemission from the oligomer semiconductor layer is represented by circle 96.

Figure 24:
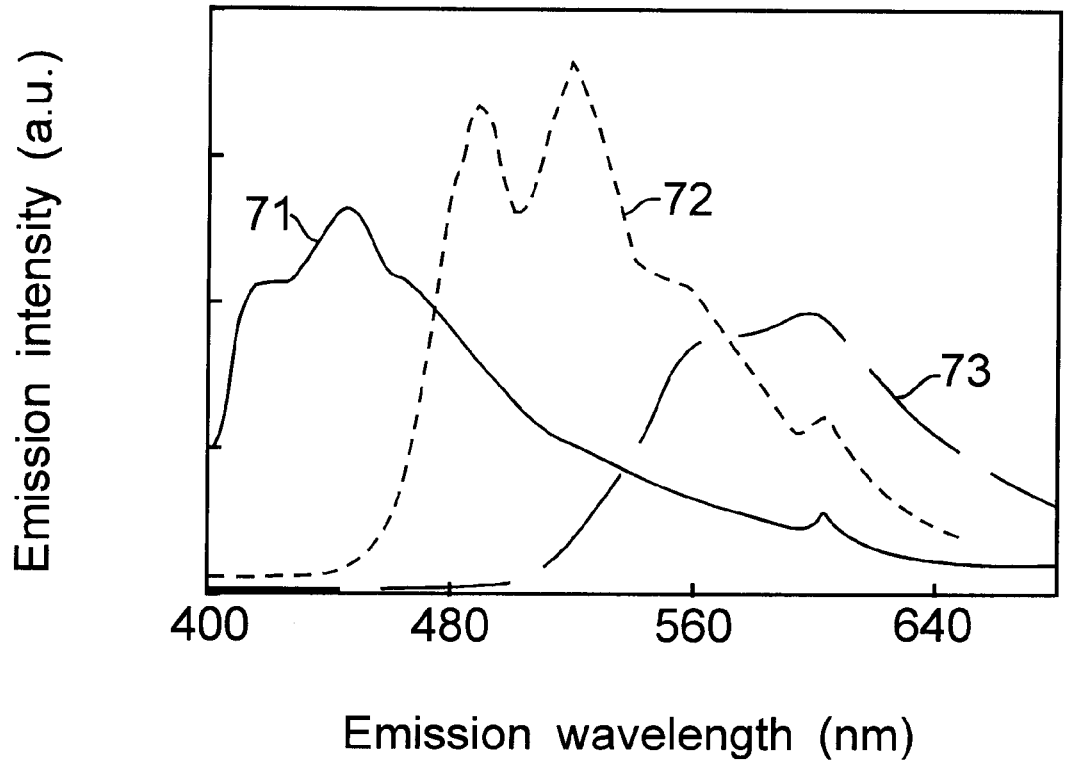
FIG. 24 is a plot of photoluminescence for three illustrative materials of the invention.

To demonstrate how the materials of the invention can be used for light emission across a large range of the spectrum, photoluminescence characteristics from three of the materials of the invention were measured and are plotted in FIG. 24. Curve 71 is a plot of the emission spectrum for 2F, curve 72 is a plot for FTF, and curve 73 is a plot for FTTF. As evident, useful emission is obtainable, using the materials of the invention, over more than 200 nm of the spectrum.

Various additional modifications of this invention will occur to those skilled in the art. All deviations from the specific teachings of this specification that basically rely on the principles and their equivalents through which the art has been advanced are properly considered within the scope of the invention as described and claimed.

I claim:

1. A method for making an integrated circuit thin film transistor device comprising a plurality of thin film field effect transistors formed on a substrate, said plurality of thin film field effect transistors each comprising a source electrode, a drain electrode, a gate electrode, and an organic semiconductor active layer, the invention characterized in that the organic semiconductor layer is formed by evaporating a thin film of a fluorene oligomer onto the substrate, the oligomer having a molecular weight of less than 2000, and comprising from 1 to 10 fluorene ring units.

2. A method for making an integrated circuit thin film transistor device by the steps comprising:

a. depositing a layer of an organic semiconductor material on a substrate, b. forming a source electrode and a drain electrode on said layer, said source electrode and drain electrode separated by a channel region, c. depositing a dielectric layer covering both said source electrode and said drain electrode, and d. forming a gate electrode overlying said channel region, the invention characterized in that the organic semiconductor material is formed by evaporating a thin film of a fluorene oligomer onto the substrate, the oligomer having a molecular weight of less than 2000, and comprising from 1 to 10 fluorene ring units.

3. A method for the manufacture of an integrated circuit thin film transistor device comprising the steps of:

a. forming a source electrode and a drain electrode on a substrate, the source electrode and the drain electrode being spaced apart leaving a channel region therebetween, b. depositing a dielectric layer covering the source electrode, the drain electrode, and the channel region, c. forming a gate electrode overlying the channel region, the invention characterized in that the organic semiconductor layer is formed by evaporating a thin film of a fluorene oligomer onto the substrate, the oligomer having a molecular weight of less than 2000, and comprising from 1 to 10 fluorene ring units.

4. An integrated circuit thin film transistor device comprising a plurality of thin film field effect transistors formed on a substrate, said plurality of thin film field effect transistors each comprising a source electrode, a drain electrode, a gate electrode, and an organic semiconductor active layer, the organic semiconductor layer comprising a fluorene oligomer having a molecular weight of less than 2000, and comprising from 1 to 10 fluorene ring units.

5. An integrated circuit thin film transistor device comprising:
   a. a layer of an organic semiconductor material on a substrate,
   b. a source electrode and a drain electrode on said layer, said source electrode and drain electrode separated by a channel region,
   c. a dielectric layer covering both said source electrode and said drain electrode, and
   d. a gate electrode overlying said channel region,
the invention characterized in that the organic semiconductor material is a fluorene oligomer having a molecular weight of less than 2000, and comprising from 1 to 10 fluorene ring units.

6. An integrated circuit thin film transistor device comprising:
   a. a source electrode and a drain electrode on a substrate, the source electrode and the drain electrode being spaced apart leaving a channel region therebetween,
   b. a dielectric layer covering the source electrode, the drain electrode, and the channel region,
   c. a gate electrode overlying the channel region,
the invention characterized in that the organic semiconductor layer is a fluorene oligomer having a molecular weight of less than 2000, and comprising from 1 to 10 fluorene ring units.

7. An injection laser comprising:
   a. a semiconductor layer having a top surface and bottom surface,
   b. a first gate electrode, source electrode, and drain electrode on the top surface of the semiconductor layer,
   c. a second gate electrode, source electrode, and drain electrode on the bottom surface of the semiconductor layer,
the invention characterized in that the semiconductor layer is a fluorene oligomer having a molecular weight of less than 2000, and comprising from 1 to 10 fluorene ring units.

* * * * *